United States Patent [19]
Burford et al.

[11] 4,156,934
[45] May 29, 1979

[54] SERIAL BUBBLE MEMORY STORE

[75] Inventors: Thomas M. Burford, 265 Summit Ave., Summit, N.J. 07901; George R. Westerman, R.D. 1, Openaki Rd., Dover, N.J. 07801; John H. Wuorinen, Jr., P.O. Box 7, Chester, N.J. 07930

[73] Assignee: Bell Telephone Laboratories, Incorporated

[21] Appl. No.: 786,294

[22] Filed: Apr. 11, 1977

[51] Int. Cl.² ............................................. G11C 19/08
[52] U.S. Cl. ........................................ 365/2; 365/12; 365/15
[58] Field of Search ................... 365/2, 5–10, 365/15, 220, 228, 229

[56] References Cited
U.S. PATENT DOCUMENTS

| | | | |
|---|---|---|---|
| 3,460,094 | 8/1969 | Pryor | 364/900 |
| 3,997,877 | 12/1976 | Naden | 365/15 |

*Primary Examiner*—James W. Moffitt
*Attorney, Agent, or Firm*—Henry T. Brendzel; Joseph P. Kearns

[57] ABSTRACT

Disclosed is a bubble memory system adapted for construction on a single construction unit such as a pluggable card and for providing to prospective users a standard interface including an input data port, an output data port, a clear port, a store enable port, read and write enable ports, register select ports and a clock port. In the memory system, a plurality of bubble memory chips are interconnected in parallel with each of the chips being separately accessed for writing or reading purposes with the aid of the register select ports. Common control of the bubble memory chips is obtained through digitally generated control signals. Low voltage protection is provided by appropriately turning off the in-plane rotating field when the power source exhibits a low voltage condition, thereby protecting the stored data.

4 Claims, 7 Drawing Figures

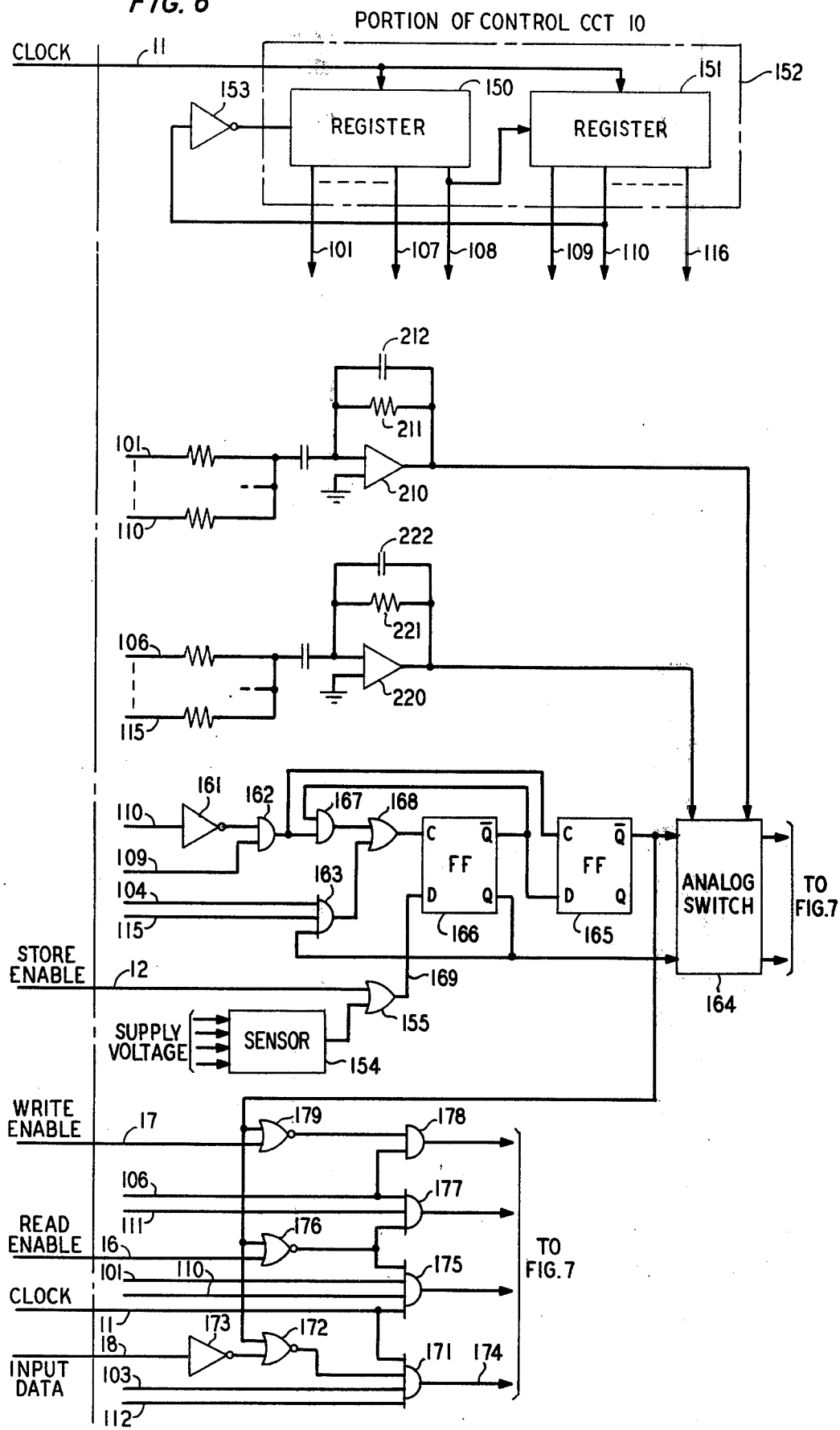

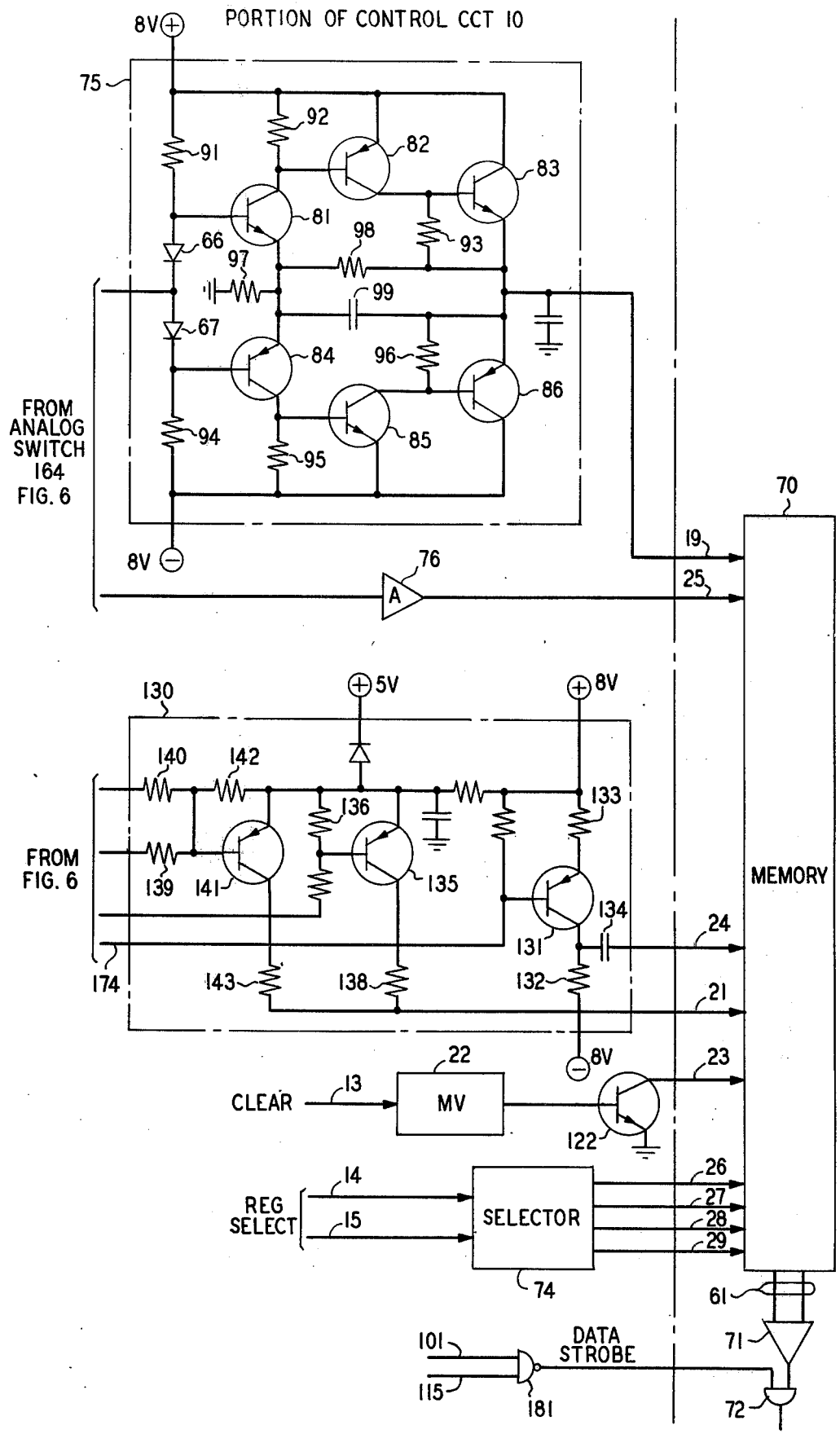

4,156,934

SERIAL BUBBLE MEMORY STORE

BACKGROUND OF THE INVENTION

1. Field of the Invention

The present invention relates to magnetic bubble domain memory systems.

2. Description of the Prior Art

In the field of electronic computers and other data processing devices, the performance of such systems is largely limited by the speed, capacity and reliability of the memory system. Various types of memory systems are known and have been used in the art, such as disc files, magnetic tapes, and ferrite cores. Recently, significant interest has been directed toward a different type of memory wherein data is stored in the form of magnetic "bubbles" moving in thin films of magnetic material. The bubbles are actually cylindrical magnetic domains whose polarization is opposite to that of the thin magnetic film in which they are embedded. The bubbles are stable over a consideralble range of conditions and can be moved from one point to another at high velocity. Interest in these devices, in large part, is based on the high packing density that can be achieved and the ability of the cylindrical domain to be independent of the boundary of the magnetic material in the plane in which it is formed. Such devices are described in an article by Andrew H. Bobeck and H. E. D. Scoville entitld "Magnetic Bubbles," *Scientific American,* June 1971, Vol. 224, pp. 88-90. This article describes several structures for manipulating and controlling transmission of magnetic bubbles along discrete paths and includes an explanantion of one form of a magnetic bubble domain memory.

Magnetic bubble domain memory systems offer significant advantages over conventional memory systems since logic, memory, counting, and switching can all be performed within a single layer of solid magnetic material. This is in contrast to conventional memory systems in which, to perform the above functions, information must move from one devie to another through interconnecting conductors and high gain amplifiers.

In order to carry out the memory functions of a bubble memory system such as logic operations, reading, writing, et cetera, it is necessary to provide an in-plane rotating field at the surface of the bubble memory chips employed in the memory system and to drive electrical current through appropriate leads on the magnetic bubble domain chip at precisely timed intervals relative to the in-plane rotating field. These currents control the magnetic bubble domains in such a way as to allow the user to write data into or read data from any desired location on the memory chip.

Typically, the cntrol signals for synchronizing the memory operations are generated by one-shot multivibrators which depend on RC discharge circuits to produce pulses of desired width and at desired intervals during each rotation of the in-plane rotating magnetic field. Various problems, however, have been encountered in utilizing multivibrators for generating these control signals.

To overcome the problems and difficulties associated with the analog control obtainable with multivibrators, Naden in U.S. Pat. No. 3,997,877, issued Dec. 14, 1976, describes a digital control system employing a read-only memory (ROM) driven by a clock-controlled counter. The counter sequentially advances through its states, providing thereby a sequence of addresses to the ROM, and the ROM contents are arranged so that each output bit develops a specified control signal, as required for the memory system.

The substantial efforts in bubble memory art have, heretofore, been directed to improving bubble chip organization and manufacturing techniques. But still, memories having a very large capacity cannot reliably be manufactured.

It is an object of this invention, therefore, to combine bubble memory chips and to form memory systems which can be constructed to any desired capacity.

It is a further object of this invention to efficiently combine a number of bubble memories with their associated controls on a single construction unit, such as a pluggable card.

It is a still further object of this invention to form a bubble memory system on a card which, with respect to the required control signals, is indistinguishable from any other serial memory system (such as a shift register).

It is an additional object of this invention to form a bubble memory system which is digitally controlled.

It is a still additional object of this invention to form a memory system which gracefully degradates with the occurrence of a low voltage source condition.

SUMMARY OF THE INVENTION

The above and other objects of the invention are achieved with a memory organization system which interconnects, in parallel, a plurality of bubble memory chips. Each of the chips may separately be accessed for writing or reading purposes, while common control is obtained through digitally generated control signals. Low voltage protection is provided by appropriately turning off the in-plane rotating field when the power source exhibits a low voltage condition, protecting thereby the stored data.

BRIEF DESCRIPTION OF THE DRAWING

FIG. 6 depicts the digital control circuit of element 10 in the memory system of FIG. 1; and FIG. 7 depicts the analog control circuits of element 10 in the memory system of FIG. 1.

DETAILED DESCRIPTION

Figure 1:
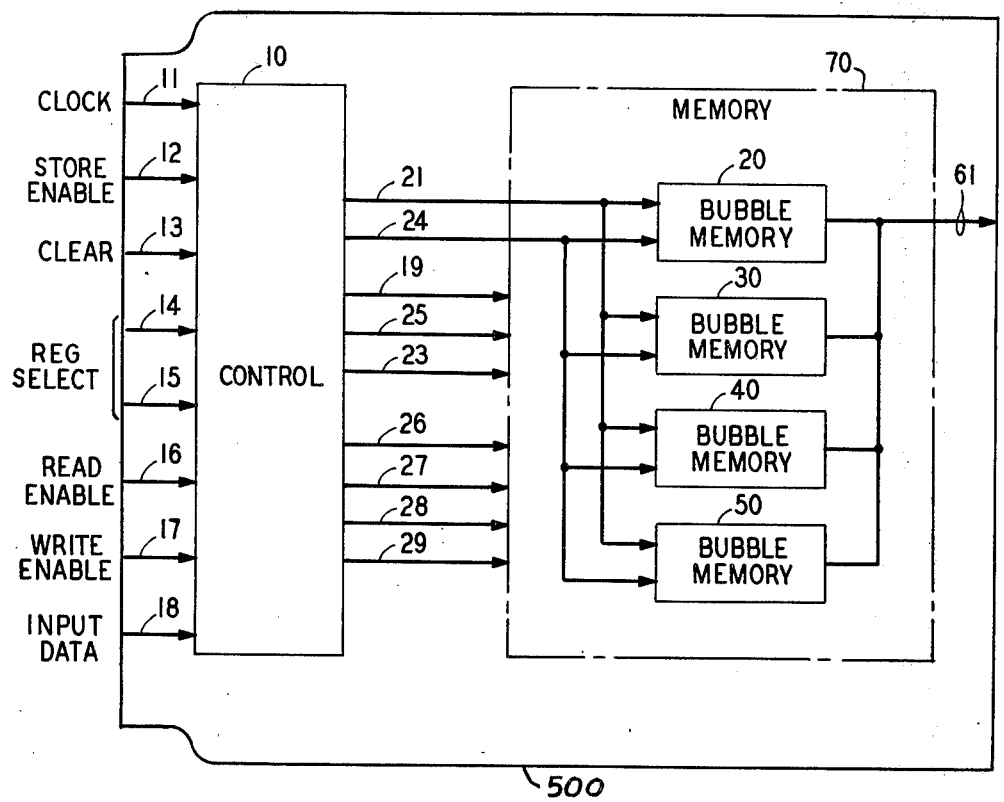
FIG. 1 is a schematic block diagram of a bubble memory system embodying the principles of this invention.

In the illustrative embodiment of FIG. 1, elements 20, 30, 40, and 50 are bubble memory chips forming memory block 70 of the system mounted on pluggable card 500. Each bubble memory chip in block 70 has a data input terminal, a data output terminal, and a write/read enable terminal. Block 70 also has four chip select terminals, a clear terminal, and two rotating field terminals which are common to, or affect all of the bubble memory chips in the block.

The memory system of FIG. 1 is arranged to form a serial memory having a total capacity equal to the sum of the chips'to capacities but with an access time equal to the access time of each individual memory chip. This arrangement is achieved by applying input data in parallel, via line 24, to chips 20 through 50, by writing data into or reading data from particular chips with the aid of selection signals 26, 27, 28, and 29 applied to the chip enable terminals, and by "collector OR" combining of the output data to provide a single output data stream on bus 61. The phrase "collector OR" refers to a physical connection of output ports for developing the equivalent of the Boolean OR function. The bubble memory chips are controlled as a group (enabled) for purposes of reading and writing via line 21 and are cleared via line 23. The two field control signals are applied to block 70 via leads 19 and 25.

Other than output bus line 61, all block 70 signals interface with element 10 which controls the operations of memory block 70. Element 10 is responsive to register select input signals on lines 14 and 15—selecting particular chips in block 70; a "clear" command signal on line 13—clearing the memory in block 70; a "store enable" command signal on line 12—enabling the memory in block 70; a clock signal on line 11—synchronizing the various operations of the FIG. 1 system; read and write enable signals on lines 16 and 17, respectively; and an input data source on line 18.

Figure 2:
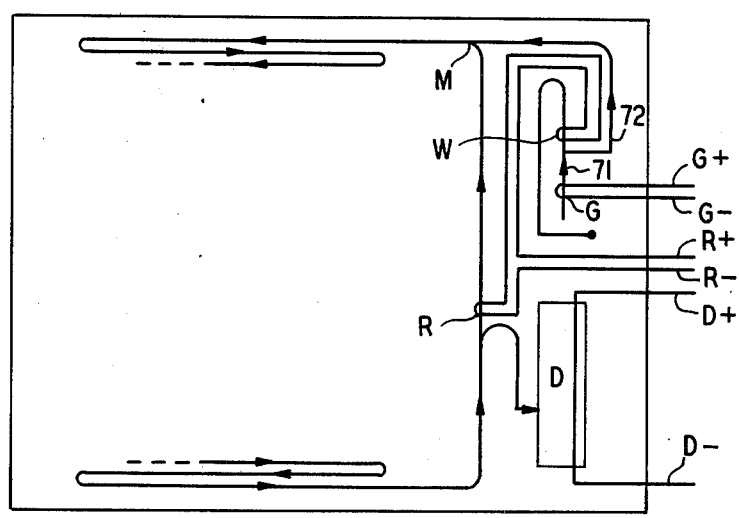
FIG. 2 is a diagram of the physical arrangement of paths in the bubble chip used in the illustrative embodiment of FIG. 1.

FIG. 2 depicts the spatial organization of the bubble memory chips employed in the illustrative embodiment of FIG. 1. Terminals G+ and G− form the input port of the chip. In response to a current sent through the input port, bubbles are generated at a point designated by the letter G and, once generated, the bubbles propagate along path 71. Terminals R+ and R− form the read/write port of the chip. In response to a current sent through the read/write port, generated bubbles are caused to divert their path at point W onto path 72, from which they enter the main loop of the chip at point M. The number of bits (individual bubbles) stored between points W and M is 60, while the number of bits stored between points G and W (along path 71) is 8.

When a write command occurs and a generated bubble is diverted at point W onto path 72, a corresponding bubble must be erased in the main storage loop of the chip so that the newly generated bubble can assume its rightful place in the queue of bubbles along the main storage loop. This is accomplished at point R in FIG. 2, where propagating bubbles are blocked in response to a write command, and effectively erased from the loop. The number of bits stored between points R and M is 60; exactly the same as the number of bits stored between points W and M.

Location R is also used for reading of data. By applying an appropriate current to terminals R+ and R−, bubbles appearing at point R are replicated; that is, are split in two, with one bubble proceeding toward point M while the other bubble being diverted and proceeding toward detector area D. Bubbles detected in area D appear as voltage pulses across terminals D+ and D−. Terminals D+ and D− form the output port of the chip.

As indicated previously, to propagate bits of data (bubbles) along the memory paths of bubble memory chips, a rotating magnetic field is necessary. The rotating field is generated by attaching two field-generating coils (an inner coil and an outer coil) to the chips, orthogonally to each other, and by driving appropriate currents through the coils.

Figure 3:
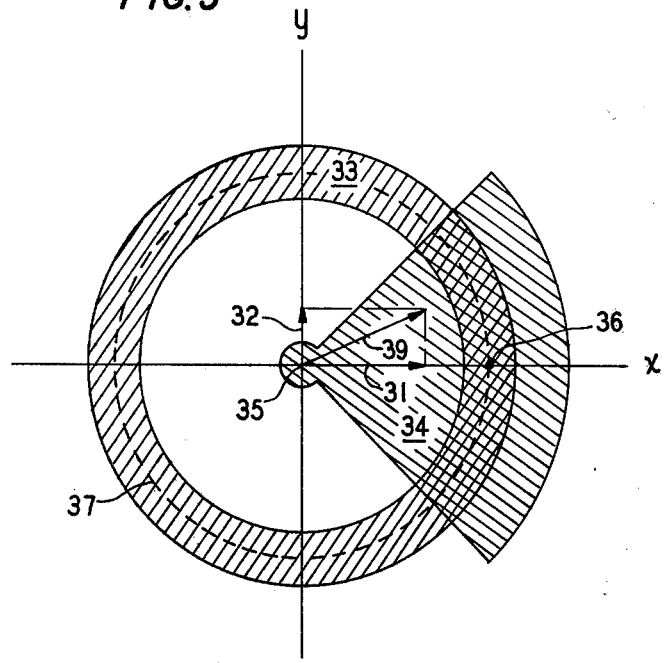
FIG. 3 is a polar coordinate diagram describing the permissible areas in which the in-plane field currents of the FIG. 2 chip can occupy.

FIG. 3 is a polar plot of the normalized coil currents required for generating the rotating magnetic field of the bubble memory chips of FIG. 2. The outer coil current is shown in FIG. 3 as a phasor 31 which varies in amplitude along the x axis, and the inner coil current is shown as a phasor 32 which varies in amplitude along the y axis. The magnetic fields developed by the two coils combine to form a single field which relates to the phasor sum of phasors 31 and 32; to wit, phasor 39.

In addition to depicting the coil currents, FIG. 3 depicts the permissible regions of current phasor sum (phasor 39). Shaded annular region 33 is the region within which the phasor sum must rotate, preferably along dotted path 37. The width of the annular region corresponds to the permissible amplitude perturbations of the currents.

When both field currents (phasors 31 and 32) are zero, phasor 39 is located at center 35. Region 34 is the area within which phasor 39 may travel from center 35 to region 33. Region 34 is a sector of approximately 90 degrees, centered about the positive x axis.

Figure 4:
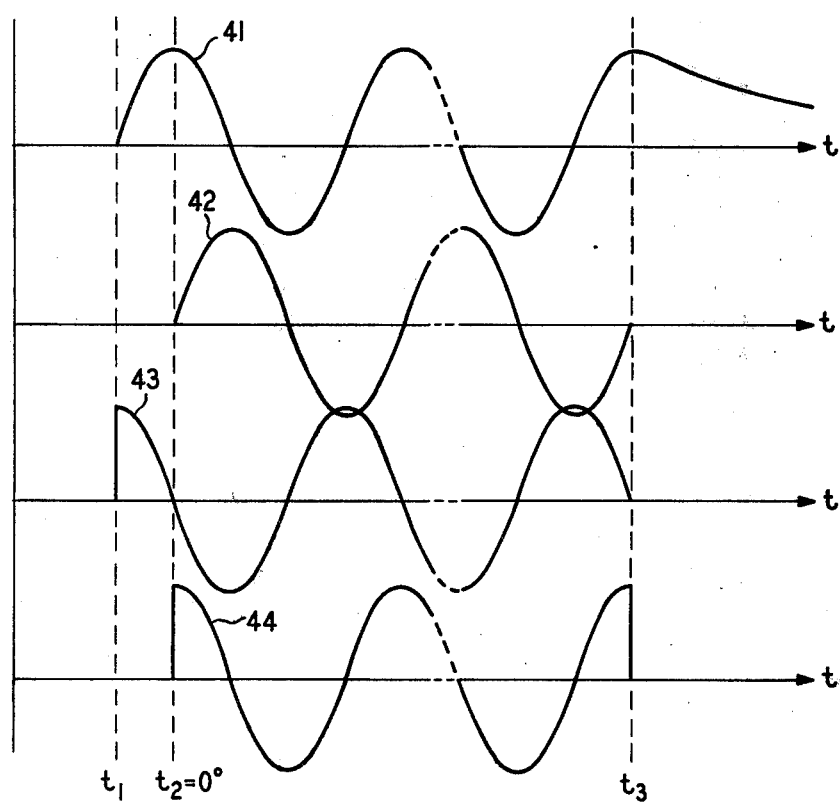
FIG. 4 depicts the field currents and driving voltages required for generating the rotating magnetic field of the bubble chips of FIG. 2.

FIG. 4 is a time diagram depicting the current (waveforms 41 and 42) required to be developed to cause the phasor sum to traverse along path 37, and the associated driving voltages (waveforms 43 and 44) which must be generated and applied to the coils. FIG. 4 also depicts the current and voltage waveforms for start-up and shut-down conditions.

The requirement for sinusoidal current waveforms may best be realized when it is observed that, as phasor 39 rotates along circular path 37, the projection of that rotation on the x and y axes relates to the cosine and sine functions, respectively. Accordingly, the outer coil current 41, and the inner coil current 42 must be sinusoids and must be 90 degrees apart. Since the currents flow through inductors (field coils), the driving voltages which develop currents 41 and 42, i.e., waveforms 43 and 44, respectively, are, of course, the derivatives of the current waveforms and are also sinusoids.

During start-up and shut-down, the current and voltage requirements are a bit different.

From FIG. 3 it may be observed that one way to reach path 37 from center 35 is to move along the x axis from center 35 to point 36 (located on both path 37 and the x axis). This is accomplished, as shown in FIG. 4, by holding current 42 (phasor 32) at zero while increasing, within interval $t_1$–$t_2$, current 41 (phasor 31) to a maximum. Once point 36 is reached, currents 41 and 42 are caused to vary sinusoidally, as discussed above, with current 42 lagging current 41 by 90 degrees.

To effect a shut-down, again the x axis within region 34 is employed. This is accomplished by detecting the instant when phasor 39 reaches point 36 and by then reducing the x axis current to zero while holding the y axis current at zero. In FIG. 4, this is illustrated by current 42 being held at zero and current 41 decaying to zero, beginning at time $t_3$. To achieve such a shut-down, voltages 43 and 44 are both set to zero at time $t_3$.

Figure 5:
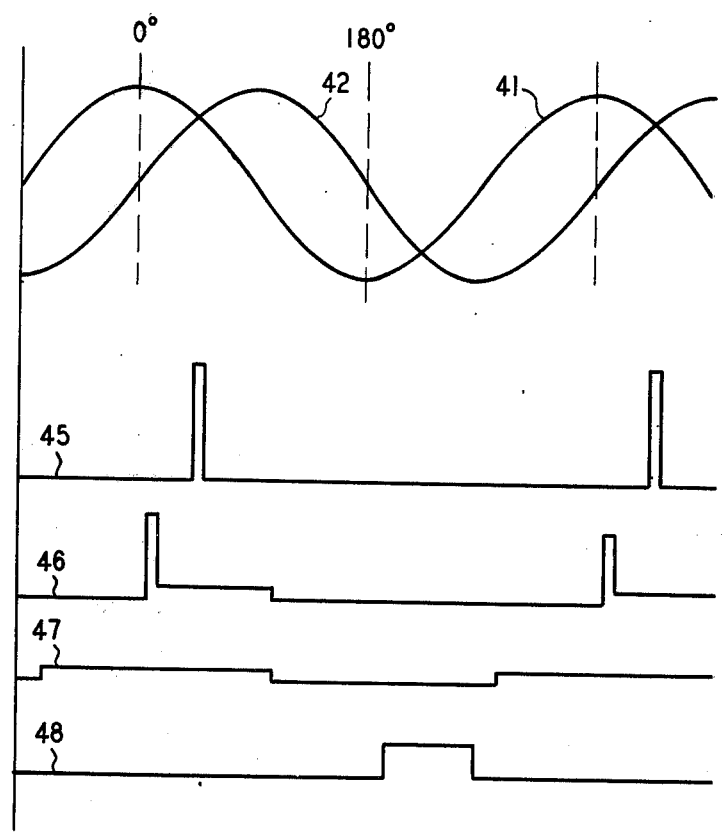
FIG. 5 illustrates the control signals required in the memory system of FIG. 1.

FIG. 5 depicts the control voltage waveforms required of the bubble memory chip of FIG. 2, as referenced to current waveforms 41 and 42. The period of sinusoidal current waveform 41 was chosen, for the illustrative purposes of this disclosure to, be 20 μsec.

Waveform 45 is the "generate" current. It comprises current pulses of 0.5 μsec duration, located 2.5 μsec from 0 degrees. The "generate" pulses are approximately 285 mA in strenght. Waveform 46 is the "replicate" current. It occurs 0.5 μsec from 0 degrees, for 0.5 μsec it has a strength of 110 mA and for succeeding 5 μsecs it has a strength of 30 mA. Waveform 47 is the "write" current. It begins 4 μsec before 0 degrees, lasts for 10 μsec and is of 30 mA strength. Finally, waveform 48 is the data strobe signal. It occurs 11 μsec following 0 degrees and terminates at 15 μsec following 0 degrees. The 0 degree point corresponds to a 0 degree angle between phasor 39 and the x axis in FIG. 3.

FIGS. 6 and 7 are the detailed schematic diagrams of element 10. FIG. 6 illustrates, basically, the digital portion of element 10 and FIG. 7 illustrates the analog portion of element 10.

Control, in element 10, originates in registers 150 and 151. Register 150, is an eight-bit shift register. It has its last output connected to the input of eight-bit register 151, and the second output of register 151 is applied through inverter 153 to the input of registers 150. Thus, register 150 and 151 form a single sixteen-bit shift register (152) having the inverse of its tenth stage fed back to the register's input. Register 152 is clocked with a 1 MHz clock, causing the outpus of register 152 to display respectively delayed square waveforms which are "high" for 10 μsec and "low" for 10 μsec.

To develop the two sinusoidal driving voltage waveforms of FIG. 4, particular outputs of register 152 are combined in a resistor network similar to the networks commonly used in digital to analog converters. Specifically, to develop the sinusoidal portion of waveform 43, leads 101 through 110 of register 152 are applied, each through a resistor of a predetermined value, to a first terminal. The signal developed at the first terminal is applied to an inverting integrator which comprises differential amplifier 210, a feedback resistor 211, and a feedback capacitor 212. The output of the integrator develops the desired waveform.

The values of the resistors connected to leads 101 through 110 are selected to best match the desired sinusoidal waveform. One acceptable set of values is:

a 100 Kohm resistor connected to lead 101;
a 33 Kohm resistor connected to lead 102;
a 22 Kohm resistor connected to lead 103;
a 18 Kohm resistor connected to lead 104;
a 15 Kohm resistor connected to lead 105;
a 15 Kohm resistor connected to lead 106;
a 18 Kohm resistor connected to lead 107;
a 22 Kohm resistor connected to lead 108;
a 33 Kohm resistor connected to lead 109; and
a 100 Kohm resistor connected to lead 110.

It may be noted that the D/A converter construction of the analog sine waveform circuit provides very precise control over the timing and the amplitude of the derived signal. Also, the realization of the analog waveforms at low current levels, as compared with a realization at high current levels, substantially reduces expected switching noise problems.

It should also be noted that maximum output at the first terminal is developed when leads 101 through 110 are all "high." However, waveform 43 at the output of amplifier 210 reaches its maximum ($t_1$ in FIG. 4) 270 degree after the maximum at the first terminal. The 270 degree delay results from the 90 degree lag of the integration process and from the 180 degree phase shift of the inversion. Thus, the maximum in the voltage waveform at the first terminal coincides with the maximum in current waveform 41.

The sinusoidal portion of waveform 44 is developed in a manner which identically parallels the development of waveform 43, to wit, leads 106 through 115 of register 152 are connected through a set of resistors to a second terminal, and the signal developed at the second terminal is applied to inverting amplifier 220 which, in combination with feedback resistor 221 and capacitor 222, integrates and inverts the voltage developed at the second terminal.

As depicted in FIG. 5, the 0 degree point is the point when current 41 reaches its peak (corresponding to point 36 in FIG. 3). The 0 degree point also coincides, as indicated above, with the maximum of the voltage waveform at the first terminal. This instant, in accordance with FIG. 4, is the time when waveform 44 is turned "on;" and 90 degrees prior to that instant is the time when waveform 43 is turned "on." Since a maximum at the first terminal is reached when lead 110 goes "high," the 0 degree instant is signified by the down transition of a pulse formed by the AND function of the signal on lead 109 and the inverse of the signal on lead 110. This is accomplished, in FIG. 6, with inverter gate 161 and AND gate 162. The pulses developed by gate 162 (appearing at times $t_2$ and $t_3$) can be used to turn "on" waveform 44 and to turn "off" waveforms 43 and 44. The −90 degree instant, which is the time when waveform 44 is turned "on" is signified by the down transition of a pulse formed by the AND function of signals from leads 104 and 115. This is accomplished, in FIG. 6, with AND gate 163.

The actual switching of waveforms 43 and 44 is done in an analog switch circuit 164 which comprises two FET transistors, each controlled by a digital signal. The FET transistors act as a switch. When the control signal connected to a transistor's gate is "low," the analog signal connected to the transistor's source appears at the transistor's drain. When the gate is "high," the analog signal does not appear at the drain. Thus, waveform 43 (out of amplifier 210) is connected to the first FET input of switch circuit 164, and waveform 44 (out of amplifier 220) is connected to the second FET of switch circuit 164. The Q output of D flip-flop 166 controls the first FET and the $\overline{Q}$ output of flip-flop 165 controls the second FET.

Flip-flop 166 is responsive to a low voltage indication signal on lead 169 and is clocked with a signal expressed by the Boolean function $109 \cdot \overline{110} \cdot Q_{166} + 104 \cdot 115 \cdot Q_{166}$, developed with AND gates 163 and 167 and OR gate 168. $Q_{166}$ and $\overline{Q}_{166}$ refer to the Q and $\overline{Q}$ outputs of flip-flop 166. Flip-flop 165 is responsive to $\overline{Q}_{166}$ and is clocked with the signal of gate 162, which is the signal $109 \cdot \overline{110}$. The "reset" input of flip-flop 165 is also connected to $\overline{Q}_{166}$.

The turn "on" and turn "off" operations of the circuit can best be described by first assuming a low voltage condition on line 169. When a low voltage condition occurs, line 169 goes "high" causing the Q output of flip-flop 166 to go high whenever a clock pulse appears at the output of OR gate 168. Once the Q output of flip-flop 166 goes "high," $\overline{Q}_{166}$ goes low, gate 167 (developing the expression $109 \cdot \overline{110}$) is disabled, gate 163 (developing the expression $104 \cdot 115$) is enabled and the $\overline{Q}$ output of flip-flop 165 goes "high" (because of the "reset" connection).

Thus, shortly after the detection of a low voltage condition, flip-flops 166 and 165 deliver "high" control voltages to switch circuit 164 (switching waveforms 43 and 44 "off"), flip-flop 165 continues to be clocked with pulses 109-110 and flip-flop 166 is clocked with pulses 104-115.

When line 169 reverts to its normal "low" position, the very next pulse of gate 163 (at position −90 degree) changes the state of flip-flop 166, causing $Q_{166}$ to go "low" and turning "on" waveform 43 in accordance with FIG. 4. At the very next pulse of gate 162 (at position 0 degrees) flip-flop 165 is caused to change state, turning "on" waveform 44 in switch circuit 164. Also, gate 163 is disabled and gate 167 is enabled, permitting both flip-flops 165 and 166 to be clocked with gate 162 pulses which occur at 0 degrees. This permits a proper turn "off," when necessary, at time $t_3$.

The low voltage indication signal emanates from low voltage detector circuit 154 followed by OR gate 155. Low voltage detector circuit 154 comprises a plurality of comparators, each comprising a predetermined fraction of a supply voltage to a reference potential. An indication of a low supply voltage from any of the comparators results in a "high" signal delivered to OR gate 155 which, in turn, delivers the "high" signal to flip-flop 166.

A second lead of OR gate 155 is responsive to the store enable input on lead 12. Whenever it is desired to disable block 70, the store enable lead is set "high," causing OR gate 155 to deliver a "high" signal to flip-flop 166.

In addition to the low voltage indication and the turn "on" and turn "off" circuitry, FIG. 6 includes logic for developing the control signals of FIG. 5.

Waveform 45 (FIG. 5) is the data read waveform. As indicated previously, it occurs 3.5 μsec after 0 degrees and is 0.5 μsec wide. In FIG. 6, the data read pulse is generated with AND gate 171 which is responsive to lead 103, lead 112, and to the clock which drives register 152. Gate 171 is also responsive to NOR gate 172 which combines the input data inverted with gate 173, and the $\overline{Q}$ output of flip-flop 165. When the $\overline{Q}$ output of flip-flop 165 is low, data is applied to AND gate 171 and is transferred to the output of gate 171 (lead 174) at the appropriate time.

Waveform 46 (FIG. 5) is the read enable waveform, and is developed by combining two waveforms; one beginning at 0.5 μsec past 0 degrees and lasting 0.5 μsec, and one beginning at 1 μsec past 0 degrees and lasting 5 μsec. The first waveform is developed in AND gate 175 which is responsive to leads 101 and 110, to the clock signal, and to a read enable control signal. The read enable control signal is applied to gate 175 through NOR gate 176 controlled by the Q output of flip-flop 165. The second waveform is developed in AND gate 177 which is responsive to the output signal of NOR gate 176 and to leads 111 and 106.

Waveform 47 (FIG. 5) is the write waveform. It is obtained by combining in AND gate 178 lead 106 with the write enable control signal obtained from NOR gate 179 which, in turn, is controlled through the $\overline{Q}$ output of flip-flop 165.

Finally, waveform 48 (FIG. 5) is the data strobe waveform. It begins at 11 μsec past 0 degrees and lasts for 4 μsec. In FIG. 7 it is obtained with AND gate 181 connected to leads 101 and 115.

FIG. 7 depicts memory block 70 and some of the attendant control circuits, the majority of which are analog.

The output signal of block 70 is amplified in detecting amplifier 71 which is a differential amplifier of standard design. Since the data output on bus line 61 is valid only at certain times, the output of amplifier 71 is strobed by the strobe signal (out of AND gate 181 in FIG. 7) in AND gate 72.

To select a particular memory block within block 70, one of the selection lines (26, 27, 28 and 29) must be activated. This is accomplished with selection network 74 which is responsive to register selection signals on leads 14 and 15. Network 74 may be a standard two line to four line converter, such as Texas Instrument, Incorporated, integrated circuit SN75462.

To drive the field currents required for block 70, two amplifiers of identical construction may be employed. FIG. 7 illustrates one of the amplifiers (75) in detail, while depicting the other amplifier (76) in block diagram form. Amplifier 75 is a class B amplifier having two complementary sections. One section includes transistors 81, 82, and 83 and the other section includes transistors 84, 85, and 86. Input signals are applied to transistors 81 and 84, connected in a common emitter mode, with resistors 91 and 94 and diodes 66 and 67 forming the input biasing network. Resistors 92 and 95 are respectively connected to the collector terminals of transistors 81 and 84 while resistor 97 connects between emitter terminals of transistors 81 and 84 and ground. The base of transistor 82 is connected to the collector terminal of transistor 81 while the base of transistor 85 is connected to the collector terminal of transistor 84. The collector terminal of transistor 82 is connected to the base of transistor 83 while the collector of transistor 85 is connected to the base of transistor 86. Across the base-emitter junction of transistors 83 and 86 are connected, respectively, resistors 93 and 96. The emitters of transistors 83 and 86 are joined, wherefrom negative feedback is provided to the joined emitters of transistors 81 and 84 through a network comprising resistor 98 connected in parallel to capacity 99. The output of amplifier 75 is derived from the joined emitters of transistors 83 and 86.

To erase the data in block 70, a pulse is provided at the clear input of element 10 on line 13. That pulse is applied, in FIG. 7, to multivibrator 22 which develops a pulse of appropriate duration. That pulse is enhanced in transistor 122 and is applied to the clear terminal of block 70 on line 23.

Finally, block 130, in response to the digital control signals developed in gates 171, 175, 177, and 178, develops the correct magnitudes for the control signals illustrated in FIG. 5.

The data pulse signal of AND gate 171 is applied to the base of transistor 131. Transistor 131 is connected in a common emitter mode, with the collector current determined by the value of resistor 133 and the voltage across it. This current is applied to bleeder resistor 132 and to input port 24 of block 70 through capacitor 134.

The "write enable" signal of gate 178 is applied to the base of transistor 135. Transistor 135 is connected in a common emitter mode, delivering a current to port 21 that is determined by collector resistor 138.

The "read enable" signal, as indicated previously, is composed of two components; one provided by gate 175 and one provided by gate 177. The output signals of gates 175 and 177 are applied, through resistors 139 and 140, respectively, to transistor 141 which is connected in a common emitter mode. The current delivered by transistor 141 is determined by collector resistor 143.

What is claimed is:

1. A bubble memory system adapted for construction on a single building unit and providing an interface indistinguishable to a prospective user from an interface of a nonbubble memory system, including an input data port, an output data port, a clear port, a store enable port, read and write enable ports, register select ports and a clock port comprising:
- a plurality of bubble memory chips subjected to a common in-plane rotating magnetic field having their input ports connected in parallel and their output ports "collector ORed";
- means, responsive to said register select ports, for accessing any one of said bubble memory chips;
- digital control means responsive to a clock signal applied at said clock port for developing control signals required for proper operation of said bubble memory chips; and
- means, responsive to the magnitude levels of supply voltages employed in said memory system, for turning off field currents of said bubble memory chips in a specified manner when a low voltage condition is detected in any of said supply voltages.

2. A memory system responsive to an input data port, a clear port, a store enable port, read and write enable ports, register select ports and a clock port comprising:
- a plurality of bubble memory chips situated on a pluggable card having their data input ports connected in parallel and their data output ports connected to achieve the Boolean OR function;
- a controller situated on said pluggable card and responsive to clock signal, for developing digitally timed control signals for affecting common control over said plurality of bubble memory chips;
- means situated on said pluggable card and responsive to said write and read enable ports for writing into and reading out of any one of said bubble memory chips; and
- low voltage detection means, situated on said pluggable card and responsive to magnitude levels of supply voltages employed in said memory system, for disabling field currents of said bubble memory chips in a specified manner when a low voltage condition is detected in any of said supply voltages.

3. The memory system of claim 2 wherein said controller comprises:
- memory means responsive to said clock for developing a cyclically advancing sequence of states;
- digital to analog converter means responsive to said memory means for developing sinusoidal waveforms 90 degrees apart; and
- logic means for developing cyclic timing signals for controlling said plurality of bubble memory chips.

4. The controller of claim 3 wherein said memory means is a shift register having one of its outputs fed back through an inverter to its input.

* * * * *